United States Patent [19]
Hawkins et al.

[11] Patent Number: 5,673,234
[45] Date of Patent: Sep. 30, 1997

[54] READ BITLINE WRITER FOR FALLTHRU IN FIFO'S

[75] Inventors: Andrew L. Hawkins; Muthukumar Nagarajan; Ajay Srikrishna, all of Starkville, Miss.

[73] Assignee: Cypress Semiconductor Corp., San Jose, Calif.

[21] Appl. No.: 572,181

[22] Filed: Dec. 13, 1995

[51] Int. Cl.$^6$ .................................................. G11C 15/00
[52] U.S. Cl. ......................... 365/239; 365/240; 365/221
[58] Field of Search ............................... 365/239, 240, 365/219, 221, 154, 220

[56] References Cited

U.S. PATENT DOCUMENTS

| | | | |
|---|---|---|---|
| 4,839,866 | 6/1989 | Ward et al. | 365/221 |
| 4,875,196 | 10/1989 | Spaderna et al. | 365/238 |
| 4,891,788 | 1/1990 | Kreifels | 365/49 |
| 5,084,837 | 1/1992 | Matsumoto et al. | 395/250 |
| 5,088,061 | 2/1992 | Golnabi et al. | 365/189.01 |
| 5,228,002 | 7/1993 | Huang | 365/219 |
| 5,262,996 | 11/1993 | Shiue | 362/221 |
| 5,305,253 | 4/1994 | Ward | 365/73 |
| 5,311,475 | 5/1994 | Huang | 365/221 |
| 5,317,756 | 5/1994 | Komatsu et al. | 395/800 |
| 5,367,486 | 11/1994 | Mori et al. | 365/189.05 |
| 5,404,332 | 4/1995 | Sato et al. | 365/201 |
| 5,406,273 | 4/1995 | Nishida et al. | 340/825.51 |
| 5,406,554 | 4/1995 | Parry | 370/58.1 |
| 5,426,612 | 6/1995 | Ichige et al. | 365/220 |
| 5,467,319 | 11/1995 | Nusinov et al. | 365/231 |
| 5,490,257 | 2/1996 | Hoberman et al. | 395/427 |
| 5,506,809 | 4/1996 | Csoppenszky et al. | 365/221 |
| 5,513,318 | 4/1996 | van de Goor et al. | 395/185.01 |
| 5,521,876 | 5/1996 | Hattori et al. | 365/221 |
| 5,546,347 | 8/1996 | Ko et al. | 365/221 |

FOREIGN PATENT DOCUMENTS

| | | |
|---|---|---|
| 0113996 | 8/1989 | Japan. |
| 0676559 | 6/1994 | Japan. |

*Primary Examiner*—David C. Nelms
*Assistant Examiner*—Vu A. Le
*Attorney, Agent, or Firm*—Bliss McGlynn, P.C.

[57] ABSTRACT

A method and apparatus for writing data onto the read bitline when a FIFO buffer memory is nearly empty that includes circuitry detecting when a memory is nearly empty, when the read pointer and the write pointer are on the same line with the read pointer behind the write pointer. Another circuit writes data onto the read bitline as the data is written into the buffer memory.

9 Claims, 2 Drawing Sheets

READ BITLINE WRITER FOR FALLTHRU IN FIFO'S

BACKGROUND OF THE INVENTION

1. Field of the Invention

The present invention pertains to data writing and data reading in FIFO buffer memories and more particularly to data writing in fallthru conditions where the read pointer and the write pointer are in the same row of the memory.

2. Related Prior Art

In present technology, data is written and read in FIFO memories at ever increasing speed. In a FIFO memory, data is written one cell at a time while data is read onto the bitlines a complete row at a time. A condition called fallthru occurs when the read pointer and the write pointer are in the same row, with the write pointer being ahead of the read pointer. In this situation, when the write pointer is not finished with the row and the read pointer is enabled, the entire row of data is read onto the bitlines. The data at the end of the row and ahead of the write pointer which was read onto the bitline will be incorrect or unreliable.

Prior art has provided a solution to this problem by shorting the read bitline and the write bitline together in the fallthru case, where the read pointer and the write pointer are in the same row with the FIFO almost empty (the write pointer is ahead of the read pointer in the row).

In a typical dual-port memory cell for a first-in first-out memory circuit, the cell is provided with a pair of write bitlines through which data in the form of a 1 or a 0, may be entered into the cell. The cell is likewise connected to a pair of read bitlines through which one can read the contents of the cell.

In such a first-in first-out memory circuit, data entered at the inputs appears at the outputs in the same order, the data "falling through" to the output queue with a small delay. While such typical design is rapid and effective in use, it is generally desirable to reduce the overall delay time for providing to the output queue the data written into the memory.

In one type of system in the prior art, rapid access to the data on memory cell write bitlines by the read bitlines of the memory cell is allowed in the case where the memory cell is being accessed by appropriate row and column pointers by shorting read and write bitlines.

This type of prior art circuit has one or more write bitlines connected with the memory cell for communicating data to the cell, one or more read bitlines connected with the memory cell for communicating data from the cell, and a logic circuit for connecting the write bitline with the read bitline independent of the cell so that data carried by the write bitline can be communicated to the read bitlines independent of the memory cell.

FIG. 1 illustrates a prior art circuit that attempts to solve the fallthru problem that can be found in U.S. Pat. No. 4,802,122. Referring to the drawing, a typical memory cell 10 is illustrated in the dotted box. This memory cell is representative of the more than one thousand that are contained in a 1 K memory array.

The memory cell 10 includes a voltage supply terminal $V_{cc}$, a resistor 14 connected to the voltage supply, $V_{cc}$, and an N-channel MOS transistor 16 having its drain connected to the resistor 14. In parallel with the resistor 14 and transistor 16 are another resistor 18 connected to the voltage supply terminal $V_{cc}$, and another N-channel MOS transistor 20 having its drain connected to the resistor 18. The sources of the transistors 16 and 20 are connected to ground terminals 22. The drain of transistor 16 is connected to the gate of transistor 20 and the drain of transistor 20 is connected to the gate of transistor 16.

N-channel MOS transistors 24, 26 have their sources connected to the drain of the transistor 16, while N-channel MOS transistors 28, 30 have their sources connected to the drain of the transistor 20. The drain of the transistor 24 connects to the external write bitline 32, while the drain of the transistor 26 connects to the external read bitline 34. Similarly, the drain of the transistor 28 connects to another external write bitline 36 while the drain of the transistor 30 connects to another external read bitline 38. The gates of the transistors 24 and 28 connect to the external write word line 40, while the gates of the transistors 26 and 30 connect to the external read word line 42. The logic states of the write word line 40 and read word line 42 are input into an AND gate 44. The output signal of the AND gate 44 is input to the gates of N-channel MOS transistors 50 and 52. Transistor 50 provides connection between the write bitline 32 and read bitline 34 when transistor 50 is on. Transistor 52 provides connection between the write bitline 36 and read bitline 38 when transistor 52 is on.

Data is communicated from a data input line through a buffer (not shown) to write bitline 32 and through an inverter (not shown) to the write bitline 36. Thus, whatever the state of the input signal, the write bitline 32 and write bitline 36 will carry opposite values (D and $\overline{D}$)). Assuming, for example, that a 1 is provided as the input signal on line 34 to be written into the memory cell 10, the write bitline 32 will carry a high signal and the write bitline 36 will carry a low signal. The write row line 40 is activated to turn transistors 24 and 28 on, so that the drain of transistor 16 goes high, turning the gate of transistor 20 on and bringing the drain of transistor 20 and the gate of transistor 16 low, so that transistor 16 is off and transistor 20 is on.

Assuming that such data is needed to be read from the memory cell 10, the read row line 42 is activated, turning on transistors 26 and 30. The cell data is placed on the read bitlines 34 and 38 and the data applied to a sense amplifier, communicating with a line from which the ultimate output is taken.

In this circuit, upon the write row line 40 and read row line 42 being simultaneously addressed, the signal from the AND gate 44 is high. The transistors 50 and 52 are turned on, providing direct communication between the write bitline 32 and read bitline 34, and also between the write bitline 36 and read bitline 38. Thus, in this situation, data is written into the memory cell 10 as was previously described. However, because of the direct communication between the lines as described above, the data being supplied by the write bitlines 32 and 36 can be read faster than in the prior art description, since the data is transferred directly from the write bitlines 32 and 36 through transistors 50 and 52 to the read bitlines 34 and 38, respectively.

An additional prior art method is the TBus Shorter method which can be used on a typical dual-port memory cell, having write and read column select circuitry. In this method the write bitlines are shorted to tbus and tbusb (the differential inputs of the sense amplifier) in order to reduce the fallthru delay.

The tbus shorter method that was previously used, placed constraints on the timing of the column select circuitry and the tbus shorter signal. When a write occurs and the write bitlines are column selected the data is written onto the write bitlines by the data input driver. When the write wordline is turned on, the memory cell is written. Now the Write operation must also flip the read bitlines through the small pass gates of the dual port memory cell. If the Write bitline driver and the write wordline turn off prior to the read bitlines being flipped then there is a possibility that the read bitlines may over-write the memory with wrong data, resulting in a functional failure, or a downbinning due to required longer cycle times.

SUMMARY OF THE INVENTION

The problem of Fallthru delay is encountered when the First-In First-Out Memory (FIFO) is operating at or near the empty boundary. The present invention provides a method and apparatus for writing data onto the read bitlines when a FIFO buffer memory is nearly empty.

The solution to the problem of fallthru delay using the Read bitline writer is to write the read bitlines along with the write bitlines in the wysel (write column select circuit) and not attempt to read the data out of the memory cell as is done in the case of a normal read.

In addition to reducing fallthru delay, the read bitline writer also eliminates some logic by reducing the constraints on the timing of the column select signals.

DESCRIPTION OF THE PREFERRED EMBODIMENT

Figure 2:
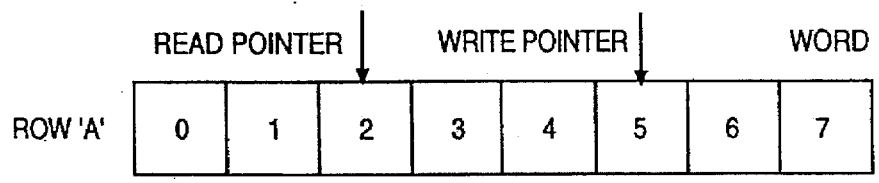
FIG. 2 is an illustration of a single row in a FIFO memory.

Referring now to FIG. 2, a diagram of a single row in a FIFO memory is illustrated. In this row A, the cells are listed as 0–7. The write pointer is at cell 5, while the read pointer is at cell 2. In this situation, the FIFO memory is almost empty since data is being read out only a few cells behind where it is being written. In this situation, when data is read the entire row of data will be transferred to the bitlines. In this situation, cells 2, 3, and 4 will have accurate, real data while cell 5 will either have real data if the data has been written prior to reading or will have worthless data if the read was enabled prior to the writing data into cell 5. Cells 6 and 7 will have unreliable or inaccurate data when transferred to the bitline. This is a situation commonly referred to as fallthru. In this situation, the FIFO memory is almost empty and the read pointer is behind but in the same row as the write pointer. Also in this situation, the write pointer has not written data into every cell in the row. Thus, when the information is read to the bitline false data is read for the cells positioned after the write pointer.

Fallthru occurs when the FIFO is at or near the Empty boundary as illustrated in FIG. 2. In look ahead FIFO architectures some or all of the data that has been read into the bitlines may be invalid, at this boundary. In this case the data written at the top of the chip must have a FAST path to the bottom of the chip and around the normal sense path.

Instead of shorting the bitlines together or shorting the write bitlines to the read TBUS, as was done in prior art, the present invention writes the read bitlines at the top of the chip. The major purpose is to achieve fast fall thru times on FIFOs while avoiding cycle time problems and speed constraints of the prior art.

Figure 1:
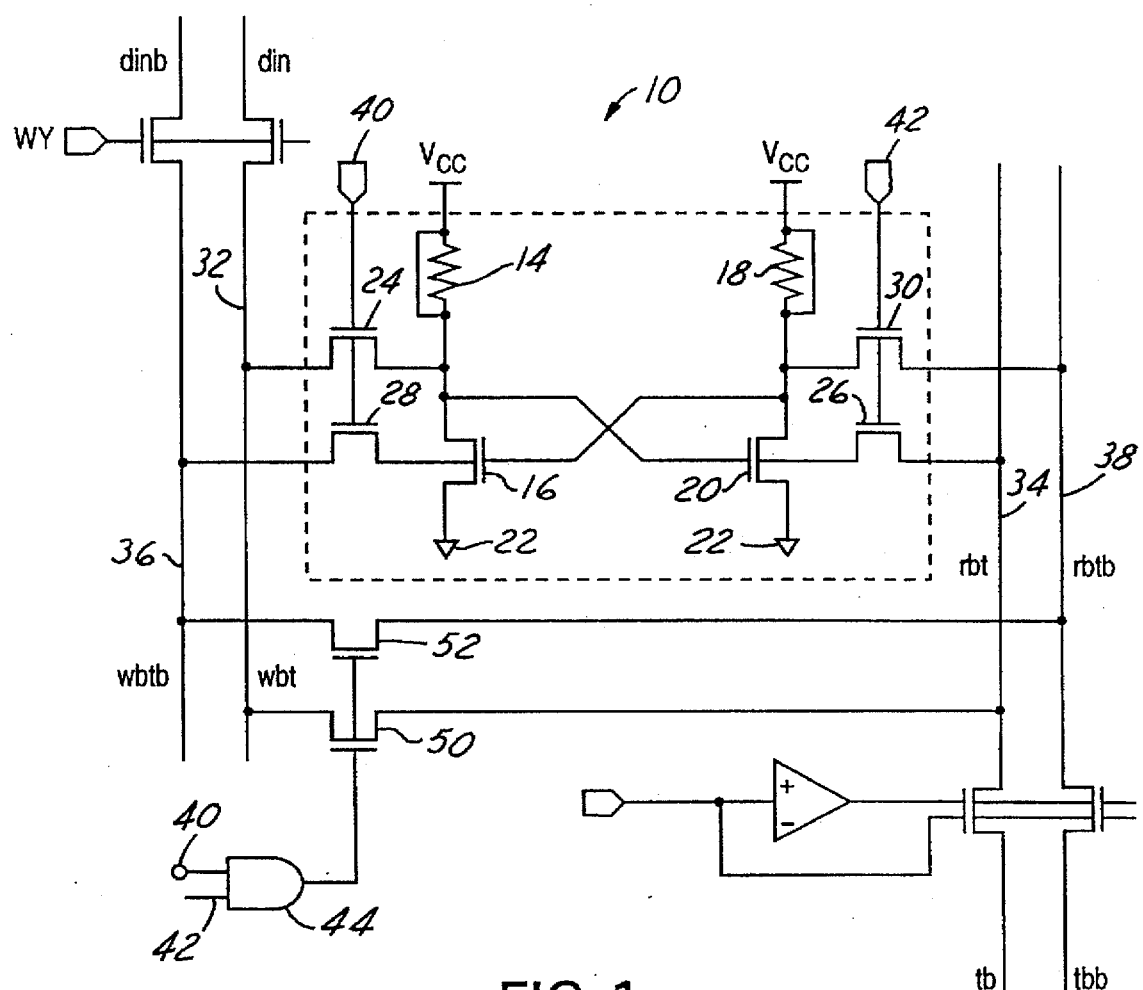
FIG. 1 is an illustration of a schematic drawing of a typical FIFO memory cell, with the bitline shorter prior art representation.
Figure 3:
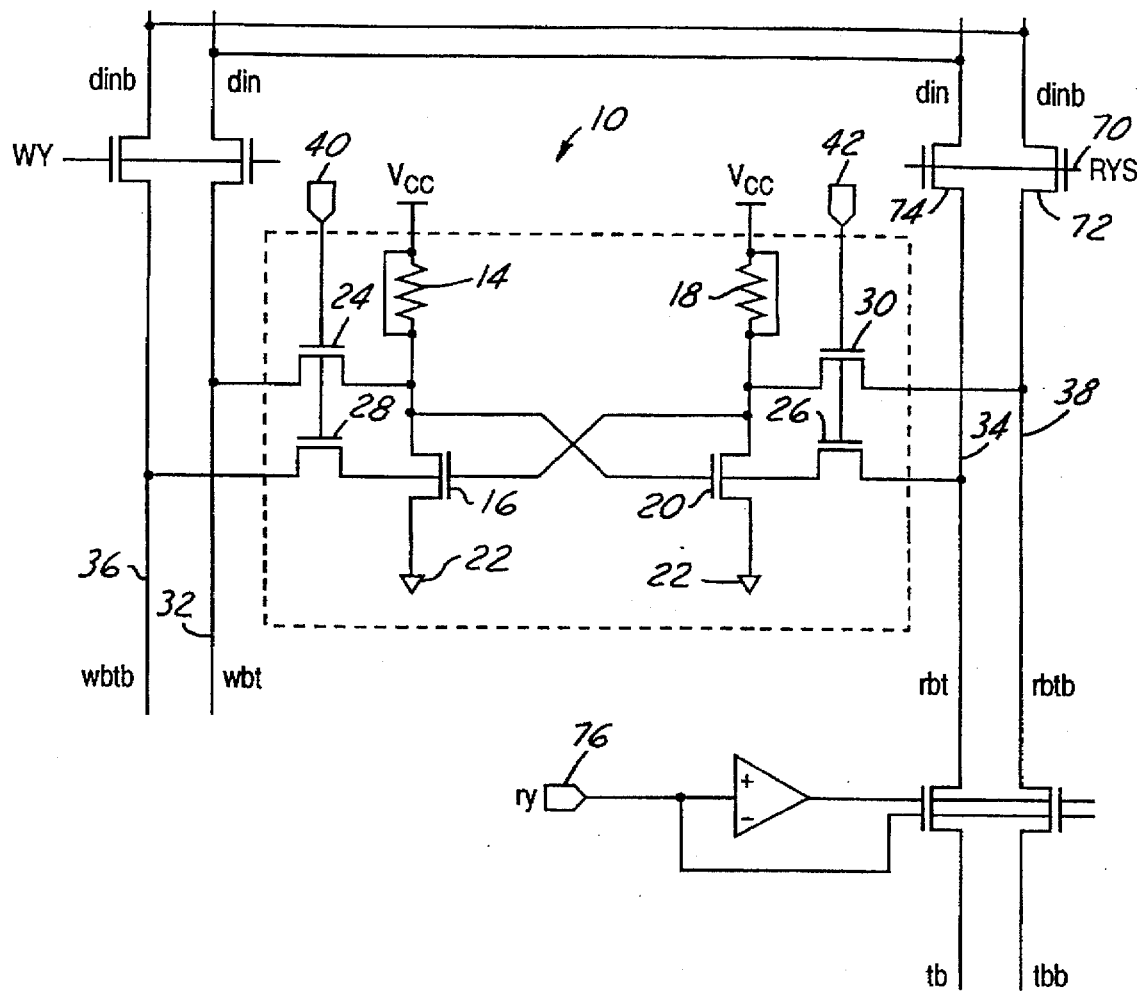
FIG. 3 is an illustration of a schematic drawing of a typical FIFO memory cell with the circuitry of the present invention.

Referring now to FIG. 3, a typical memory cell 10 is illustrated in the dotted box. This memory cell is almost identical to the memory cell illustrated in FIG. 1 and includes the same numerals for identical parts. This memory cell is representative of the more than one thousand that are contained in a nominal 1 K memory array.

FIG. 3 illustrates the dual port memory cell used in the FIFO, along with the column select circuitry and the read bitline writer pass transistor. The following acronyms are used in the Figure for signal names.

wwl—write wordline enable
rwl—read wordline enable
wbl—write bitline
wblb—write bitline bar
rbl—read bitline
rblb—read bitline bar
wy—write column select
rys—read bitline writer signal
ry—read column select
din—output of the data input driver
dinb—output of the data input driver The signals wwl and wy define the write pointer while the signals rwl and ry define the read pointer.

The memory cell 10 includes a voltage supply, $V_{cc}$, with a resistor 14 connected to the voltage supply, $V_{cc}$, and an N-channel MOS transistor 16 having its drain connected to the resistor 14. In parallel with the resistor 14 and transistor 16 are another resistor 18 connected to the voltage supply $V_{cc}$, and another N-channel MOS transistor 20 having its drain connected to the resistor 18. The sources of the transistors 16 and 20 are connected to ground terminals 22. The drain of transistor 16 is connected to the gate of transistor 20 while the drain of transistor 20 is connected to the gate of transistor 16.

N-channel MOS transistors 24, 26 have their sources connected to the drain of the transistor 16, while N-channel MOS transistors 28, 30 have their sources connected to the drain of the transistor 20. The drain of the transistor 24 connects to the external write bitline 32, while the drain of the transistor 26 connects to the external read bitline 34. Similarly, the drain of the transistor 28 connects to another external write bitline 36 while the drain of the transistor 30 connects to another external read bitline 38. The gates of the transistors 24 and 28 connect to the external write word line 40, while the gates of the transistors 26 and 30 connect to the external read word line 42.

Data is communicated from a data input line through a buffer (not shown) to write bitline 32 and through an inverter (not shown) to the write bitline 36. Thus, whatever the state of the input signal, the write bitline 32 and write bitline 36 will carry opposite values (D and E)). Assuming, for example, that a 1 is provided as the input signal on line 34 to be written into the memory cell 10, the write bitline 32 will carry a high signal and the write bitline 36 will carry a low signal. The write row line 40 is activated to turn transistors 24 and 28 on, so that the drain of transistor 16 goes high, turning the gate of transistor 20 on and bringing the drain of transistor 20 and the gate of transistor 16 low, so that transistor 16 is off and transistor 20 is on.

Assuming that such data is needed to be read from the memory cell 10, the read row line 42 is activated, turning on transistors 26 and 30. The cell's data is placed on the read bitlines 34 and 38 and the data applied to a sense amplifier, communicating with a line from which the ultimate output is taken.

The problem of fallthru delay occurs when the FIFO is operating at the empty boundary and the read pointer is on the same row as the write pointer, but behind it. When the read pointer is on the same row as the write pointer, a signal called wreq is generated internally to indicate this condition. This may be accomplished by any circuit in the art that detects this condition.

The indication of this condition causes a signal rys to be generated at terminal 70, which is the logical AND of wreq (the write read wordline equality signal) and wy (the appropriate column select signal). This enables the data transfer gates 72 and 74 and causes the data from the data input driver to be written onto the read bitlines, in addition to being written on the write bitlines. The signal ry at terminal 76 is also active at this time and the data is fed through to tbus and tbusb, thereby eliminating the need to read from the memory cell and incur a fallthru delay.

The Read bitline writer has the several advantages over previous implementations. First, it eliminates the potential problem of the memory cell being overwritten by the read bitlines, as in the case of the tbus shorter in prior art. Second, it eliminates the critical nature of the timing of the column select signals and the tbus shorter signals. This results in a reduction of logic which in turn results in a reduction of layout area.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

We claim:

1. A method for writing data onto a read bitline of a FIFO buffer comprising the steps of:

connecting a data input to said read bitline, wherein said read bitline is not shorted to a write bitline;

detecting when a read pointer and a write pointer are in the same row; and writing data from the data input to the read bitline as the data from the data input is written to a write bitline when said read pointer and said write pointer are in the same row.

2. An apparatus for writing data onto a read bitline in a FIFO memory having a read pointer, a write pointer and a data input line, the apparatus comprising:

access means connected directly between said data input line and said read bitline for controlling data flow between said data input line and said read bitline, said access means having an on state and an off state wherein said information flows between said data input line and said read bitline when said access means is in said on state;

means for generating a control signal when the read pointer and the write pointer are in the same row with the read pointer behind the write pointer; and means for placing said access means in said on state in response to said control signal.

3. The apparatus according to claim 2 wherein said access means includes one or more MOS transistors each having a gate connected to said means for placing.

4. An apparatus for providing data directly onto the read bitline in a FIFO memory comprising:

read pointer means for indicating a memory cell to be read;

write pointer means for indicating a memory cell to be written;

means for detecting when the memory is nearly empty;

access means connected directly between a data input line and a read bitline for controlling data flow between said input line and said read bitline, said access means having an on state and an off state, wherein information flows between said data input line and said read bitline when said access means is in said on state;

pointer detecting means for generating a control signal when the read pointer and the write pointer are in the same row with the read pointer behind the write pointer; and means for placing said access means in said on state in response to said control signal.

5. A method for providing data directly onto the read bitline in a FIFO memory comprising the steps of:

indicating a memory cell to be read with a read pointer;

indicating a memory cell to be written with a write pointer;

detecting when the memory is nearly empty;

connecting a data input line and read bitline directly through a gate having an on state and an off state;

controlling data flow between said input lines and said read bitlines by controlling said on state and said off state;

detecting when the read pointer and the write pointer are in the same row with the read pointer behind the write pointer; and placing said gate in said on state when said memory is nearly empty and said read pointer and said write pointer are in the same row with the read pointer behind the write pointer.

6. The method according to claim 1 wherein:

said read bitline comprises one or more read bitlines; and said write bitline comprises one or more write bitlines.

7. The apparatus according to claim 2 wherein said read bitline comprises one or more read bitlines.

8. The apparatus according to claim 4 wherein said read bitline comprises one or more read bitlines.

9. The method according to claim 5 wherein said read bitline comprises one or more read bitlines.

* * * * *